(12) United States Patent
Pronozuk et al.

(10) Patent No.: US 9,192,078 B2
(45) Date of Patent: Nov. 17, 2015

(54) MAINTAINING THERMAL UNIFORMITY AMONG DEVICES IN A MULTI-DEVICE ENCLOSURE

(71) Applicant: Seagate Technology LLC, Cupertino, CA (US)

(72) Inventors: Anthony John Pronozuk, Loveland, CO (US); Shawn Jacob Noland, Longmont, CO (US); James Edward Dykes, Longmont, CO (US); William Leon Rugg, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 183 days.

(21) Appl. No.: 14/076,538

(22) Filed: Nov. 11, 2013

(65) Prior Publication Data

US 2014/0362521 A1 Dec. 11, 2014

Related U.S. Application Data

(60) Provisional application No. 61/833,627, filed on Jun. 11, 2013.

(51) Int. Cl.
*H05K 7/20* (2006.01)
*G06F 1/20* (2006.01)
*G11B 33/14* (2006.01)

(52) U.S. Cl.
CPC .............. *H05K 7/20836* (2013.01); *G06F 1/20* (2013.01); *G11B 33/142* (2013.01); *G11B 33/1426* (2013.01); *H05K 7/20418* (2013.01); *H05K 7/20472* (2013.01); *H05K 7/20727* (2013.01); *H05K 7/20736* (2013.01)

(58) Field of Classification Search
CPC ..... H05K 7/20; H05K 7/20418; H05K 7/727; H05K 7/20836; G06F 1/20; G11B 33/142; G11B 33/1426; H01L 23/28; H01L 23/31; H01L 23/473
USPC ....................... 361/679.46–679.55, 688, 689, 361/690–697, 704–712, 715–727; 165/80.2, 80.3, 80.4, 80.5, 104.33, 165/121–126, 185; 257/706–727; 454/184
See application file for complete search history.

(56) References Cited

U.S. PATENT DOCUMENTS

| | | | |
|---|---|---|---|
| 6,459,571 B1 | 10/2002 | Carteau | |
| 6,462,410 B1 * | 10/2002 | Novotny et al. | ............... 257/707 |
| 6,496,366 B1 | 12/2002 | Coglitore et al. | |
| 7,305,458 B2 | 12/2007 | Hsue et al. | |
| 7,418,623 B2 | 8/2008 | Elliott et al. | |

(Continued)

*Primary Examiner* — Michail V Datskovskiy
(74) *Attorney, Agent, or Firm* — Hall Estill Attorneys at Law

(57) ABSTRACT

Apparatus and method for maintaining processing devices at a nominally common temperature, such as but not limited to storage devices in a multi-device networked storage enclosure. In accordance with some embodiments, an enclosed housing has a first side adjacent a cold zone with a lower ambient temperature and an opposing second side adjacent a warm zone with a higher ambient temperature. First and second processing devices are arranged within the enclosed housing so that the first processing device is adjacent the cold zone and the second processing device is adjacent the warm zone. First and second thermal interface material (TIM) modules are contactingly affixed to the first and second devices and are provided with different heat conductivities so that the first and second devices are maintained at a nominally common operational temperature.

20 Claims, 6 Drawing Sheets

(56) References Cited

U.S. PATENT DOCUMENTS

| | | |
|---|---|---|
| 7,536,586 B2 | 5/2009 | Ahmadian et al. |
| 7,568,122 B2 | 7/2009 | Mechalke et al. |
| 7,877,626 B2 | 1/2011 | Piszczek et al. |
| 8,010,713 B2 | 8/2011 | Matumura et al. |
| 8,202,765 B2 * | 6/2012 | Casey et al. .................. 438/122 |
| 8,296,406 B2 | 10/2012 | Kasperson et al. |
| 8,421,217 B2 * | 4/2013 | Casey et al. .................. 257/704 |
| 8,582,297 B2 * | 11/2013 | Edwards et al. ............... 361/708 |
| 2007/0230110 A1 | 10/2007 | Starr et al. |
| 2008/0237841 A1 * | 10/2008 | Arana et al. ................... 257/712 |
| 2009/0231800 A1 | 9/2009 | Franz et al. |
| 2010/0181665 A1 * | 7/2010 | Casey et al. .................... 257/723 |
| 2012/0199333 A1 * | 8/2012 | Edwards et al. ............... 165/185 |
| 2012/0325127 A1 | 12/2012 | Adrain |
| 2013/0151769 A1 | 6/2013 | Childs et al. |
| 2013/0219101 A1 | 8/2013 | Hansen et al. |

* cited by examiner

FIRST (LOWEST) LAYER (Z1)

| (X1,Y1,Z1) | (X1,Y2,Z1) | (X1,Y3,Z1) | → TIM(A,B,C) |
| --- | --- | --- | --- |
| (X2,Y1,Z1) | (X2,Y2,Z1) | (X2,Y3,Z1) | → TIM(A,B,C) |
| (X3,Y1,Z1) | (X3,Y2,Z1) | (X3,Y3,Z1) | → TIM(A,B,C) |
| (X4,Y1,Z1) | (X4,Y2,Z1) | (X4,Y3,Z1) | → TIM(A,B,C) |

SECOND (INTERMEDIATE) LAYER (Z2)

| (X1,Y1,Z2) | (X1,Y2,Z2) | (X1,Y3,Z2) | → TIM(A,B,C) |
| --- | --- | --- | --- |
| (X2,Y1,Z2) | (X2,Y2,Z2) | (X2,Y3,Z2) | → TIM(D,E,F) |
| (X3,Y1,Z2) | (X3,Y2,Z2) | (X3,Y3,Z2) | → TIM(D,E,F) |
| (X4,Y1,Z2) | (X4,Y2,Z2) | (X4,Y3,Z2) | → TIM(A,B,C) |

MAINTAINING THERMAL UNIFORMITY AMONG DEVICES IN A MULTI-DEVICE ENCLOSURE

RELATED APPLICATION

This application makes a claim of domestic priority under 35 U.S.C. §119(e) to U.S. Provisional Application No. 61/833,627 filed Jun. 11, 2013, the contents of which are incorporated by reference.

SUMMARY

Various embodiments of the present disclosure are generally directed to maintaining processing devices within a multi-device enclosure at a nominally uniform operational temperature, such as but not limited to storage devices in a multi-device networked storage enclosure.

In accordance with some embodiments, an enclosed housing has a first side adjacent a cold zone at a lower ambient temperature and an opposing second side adjacent a warm zone at a higher ambient temperature. First and second processing devices are arranged within the enclosed housing so that the first processing device is adjacent the cold zone and the second processing device is adjacent the warm zone. First and second thermal interface material (TIM) modules are contactingly affixed to the first and second devices and have different heat conductivities so that the first and second devices are maintained at a nominally common operational temperature.

DETAILED DESCRIPTION

Figure 1:
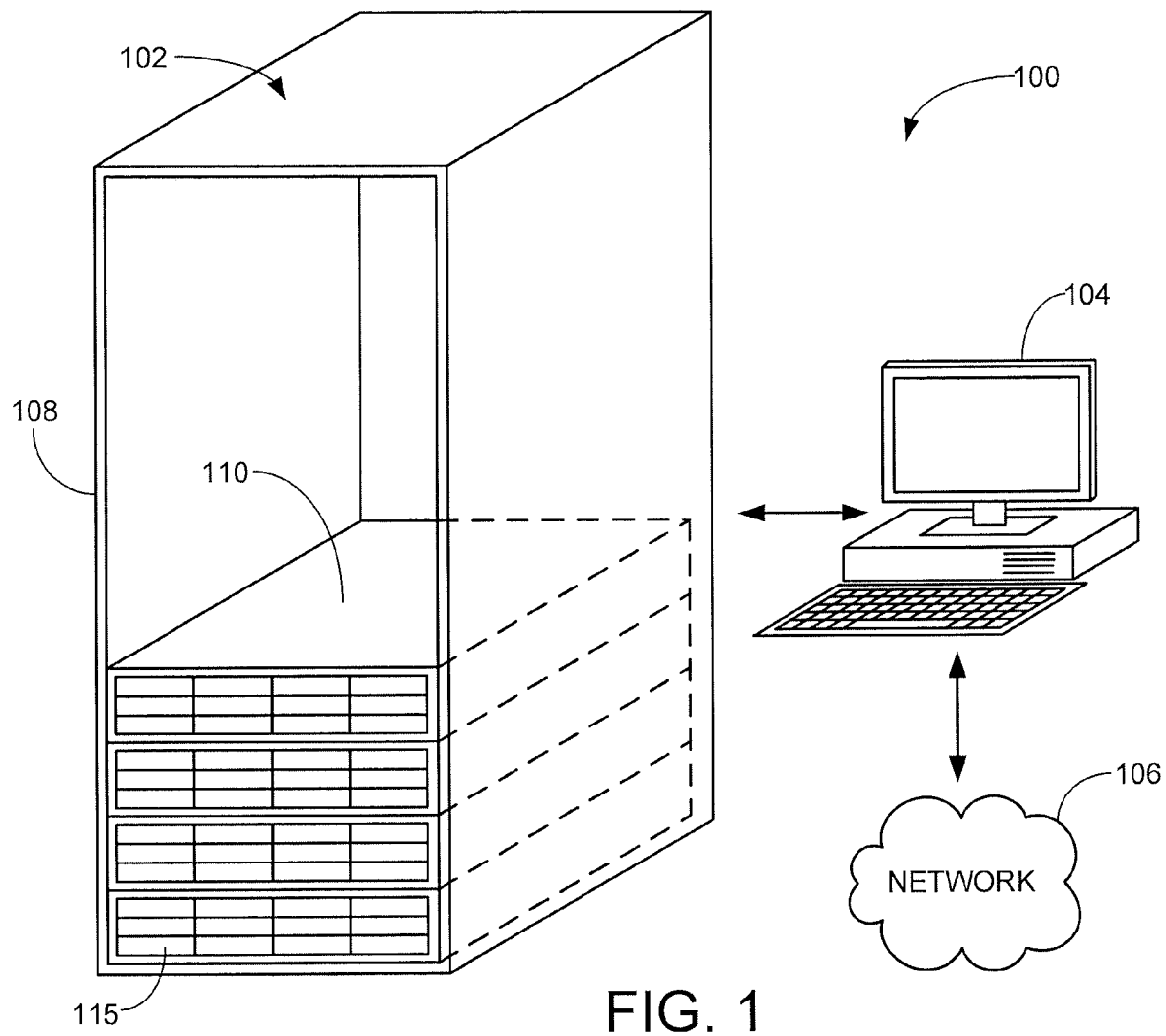
FIG. 1 is a functional representation of a storage rack which houses a number of storage enclosures in accordance with some embodiments.

The present disclosure generally relates to processing systems, and more particularly to an enclosure configuration that nominally maintains thermal uniformity among various serially arranged processing devices, such as networked data storage devices in a storage enclosure.

Networked mass storage systems, such as object storage systems used in cloud computing environments, often employ multiple data storage devices which are operationally arranged to provide a relatively high data capacity memory storage space. The devices may be grouped together into a storage enclosure that can be removably installed into a rack system (e.g., a server cabinet).

Storage systems can take a variety of forms including servers, cloud storage modules, RAID (redundant array of independent discs) systems, extended memory systems (JBODs, or "just a box of drives"), etc. The storage systems can be accessed locally or over a network including a local area network (LAN), a wide area network (WAN), the Internet, etc.

While operable to provide highly efficient computer storage, conventional storage systems can be subject to a variety of limitations including excessive heat generation and buildup, which can reduce the operational reliability and power of the various components in the storage systems, particularly the individual data storage devices.

Accordingly, various embodiments of the present disclosure are generally directed to an apparatus and method for maintaining thermal uniformity among processing devices in an enclosure, such as but not limited to data storage devices in a storage enclosure. As explained below, in some embodiments a storage enclosure has a housing adapted to be mounted within a rack system between a cold zone and a warm zone. The cold zone may be a cold aisle proximate a front portion of the storage enclosure and the warm zone may be a warm aisle proximate a rear portion of the storage enclosure.

A plurality of data storage devices, such as hard disc drives (HDDs), solid state drives (SSDs), hybrid drives, etc., are mounted in the housing and arranged in series (sequential relation) between the cold zone and the warm zone. The storage enclosure may include a number of additional components including fans, power supplies, controller boards, etc.

Each device is provided with a layer of thermal interface material (TIM) to provide a heat conduction path from the device to the housing. The TIM layers each have a different thermal conductivity in relation to the distance from the cold zone (e.g., distance from the front of the storage enclosure) to the associated storage device. Devices provided relatively closer to the cold zone have a lower performance thermal conductivity path and devices that are relatively farther from the cold zone have a higher performance thermal conductivity path. In this way, the amount of heat that is dissipated by each device is the same, and all of the devices will maintain a uniform temperature that is within a selected temperature range (e.g., within +/−5 degrees C., etc.) despite the fact that each drive is exposed to a different ambient temperature. Such thermal uniformity can help to enhance the operational reliability of the storage enclosure by reducing localized hotspots within the enclosure.

While data storage devices are a particularly useful type of processing device to which the various techniques discussed herein can be applied, it will be appreciated that other processing devices, such as electronic systems, controllers, boards, operational modules, etc. can also benefit from the various applied techniques and are included within the present disclosure.

These and other features can be understood beginning with a review of FIG. 1 which generally depicts a storage system 100 in accordance with some embodiments. The system 100 includes a storage assembly 102 coupled to a computer 104 which in turn is connected to a network 106. The computer 104 can take a variety of forms such as a work station, a local personal computer, a server, etc. The storage assembly 102 includes a server cabinet (rack) 108 and a plurality of modular storage enclosures 110. In some cases, the storage system 100 represents a storage node of an object storage system.

The storage rack 108 is a 42 U server cabinet with 42 units (U) of storage, with each unit comprising about 1.75 inches (in) of height. The width and length dimensions of the cabinet can vary but common values may be on the order of about 24 in.×36 in. Each storage enclosure can be a multiple of the storage units, such as 2 U, 3 U, etc. Fully populating the rack 108 with storage enclosures 110 can provide several Petabytes ($10^{15}$ bytes) or more of storage for the storage node.

Figure 2:
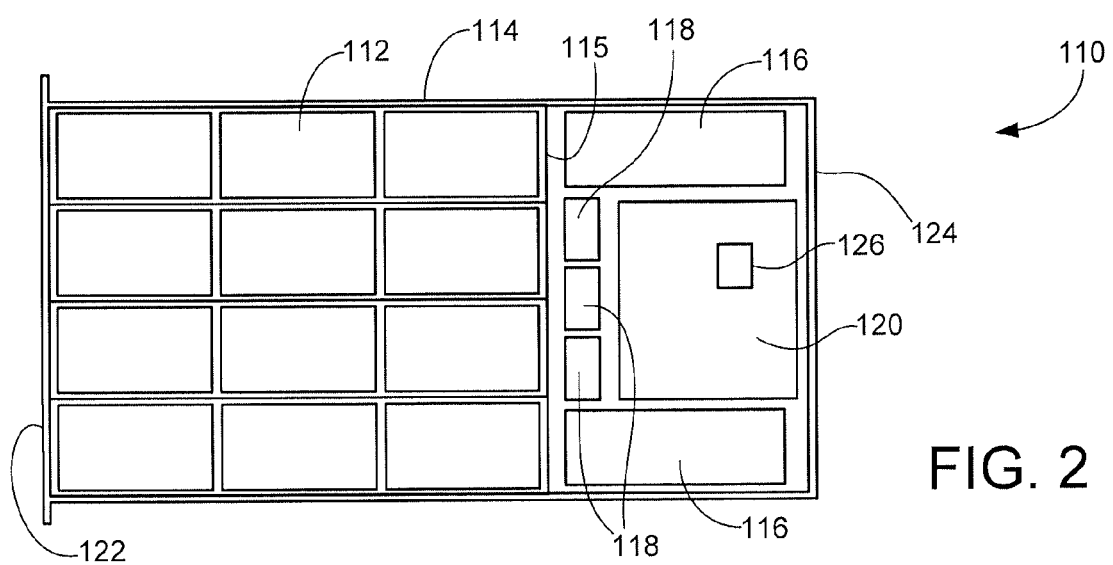
FIG. 2 is a top plan representation of a selected storage enclosure from FIG. 1 in accordance with some embodiments.

One example configuration for the storage enclosures 110 is shown in FIG. 2. The configuration in FIG. 2 is a 36/2 U configuration with 36 (3×3×4) data storage devices 112 in a 2 U form factor height housing 114. A variety of other configurations can be used including storage enclosures with a total of N drives where N=12, 16, 20, 24, 30, 32, 48, etc. Sleds 115 can be used to secure multiple sets of the storage devices 112. As desired, the sleds can be individually extended and retracted from the housing 114.

The storage enclosure 110 includes dual power supplies 116, multiple airflow fans 118 and at least one controller board 120. The power supplies 116 provide electrical power for the storage enclosures 110. The fans 118 draw airflow from openings (not separately shown) in a front facing side 122 of the housing 114 and pull the airflow through the housing and out openings (not shown) in a rear facing side 124 of the housing.

The controller 120 may have one or more intelligent processors 126 and can take a variety of configurations including but not limited to a server, a controller (including dual redundant RAID controllers), a cloud controller, dual port controllers, an Ethernet drive controller, etc. Other support electronics and components can be provided in the storage enclosure 110 as well, including a boot storage memory device, wiring cables, switches, brackets, LED indicators, etc. A redundant design is provided so that substantially any active failed component can be replaced while maintaining the device in an operational condition, including an entire sled of storage devices in which at least one device has failed. Other relative arrangements and placements of the various active elements within the enclosure can be provided as desired.

Figure 3:
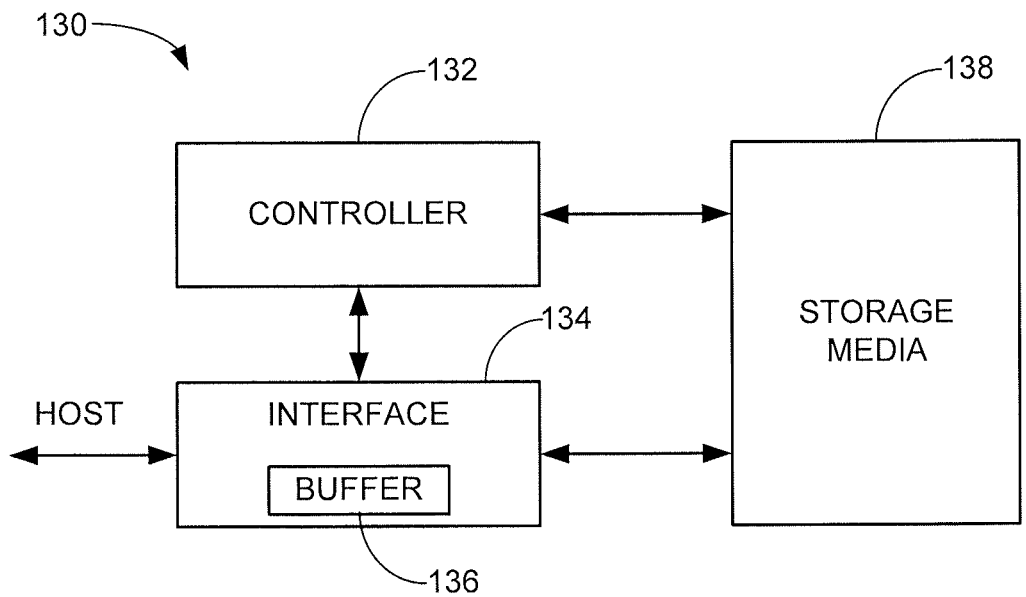
FIG. 3 is a functional block representation of a selected data storage device from FIG. 2 in accordance with some embodiments.

The storage devices can take a variety of processing device configurations, such as but not limited to a hard disc drive (HDD), a solid state drive (SSD), a hybrid drive, etc. FIG. 3 is a functional block diagram for a generalized data storage device 130 in accordance with some embodiments. The data storage device 130 includes a programmable controller 132, an interface circuit 134 with a data buffer 136 and storage media 138. The controller 132 directs data transfers between the storage media 138 and a host device, such as the controller 104 in FIG. 1.

In the context of an HDD, the storage media 138 may take the form of one or more axially aligned magnetic recording discs which are rotated at high speed by a spindle motor. Data transducers can be arranged to be controllably moved and hydrodynamically supported adjacent recording surfaces of the storage disc(s). While not limiting, in some embodiments the storage devices 130 are 3½ inch form factor HDDs with nominal dimensions of 5.75 in×4 in×1 in.

In the context of an SSD, the storage media 138 may take the form of one or more flash memory arrays made up of non-volatile flash memory cells. Read/write/erase circuitry can be incorporated into the storage media module to effect data recording, read back and erasure operations. Other forms of solid state memory can be used in the storage media including magnetic random access memory (MRAM), resistive random access memory (RRAM), spin torque transfer random access memory (STRAM), phase change memory (PCM), in-place field programmable gate arrays (FPGAs), electrically erasable electrically programmable read only memories (EEPROMs), etc.

In the context of a hybrid device, the storage media 138 may take multiple forms such as one or more recording discs and one or more modules of solid state non-volatile memory (e.g., flash memory, etc.). Other configurations for the storage devices 112 are readily contemplated, including other forms of processing devices besides devices primarily characterized as data storage devices, such as computational devices, circuit cards, etc. that at least include computer memory to which secure erasure processing is applied.

Figure 4:
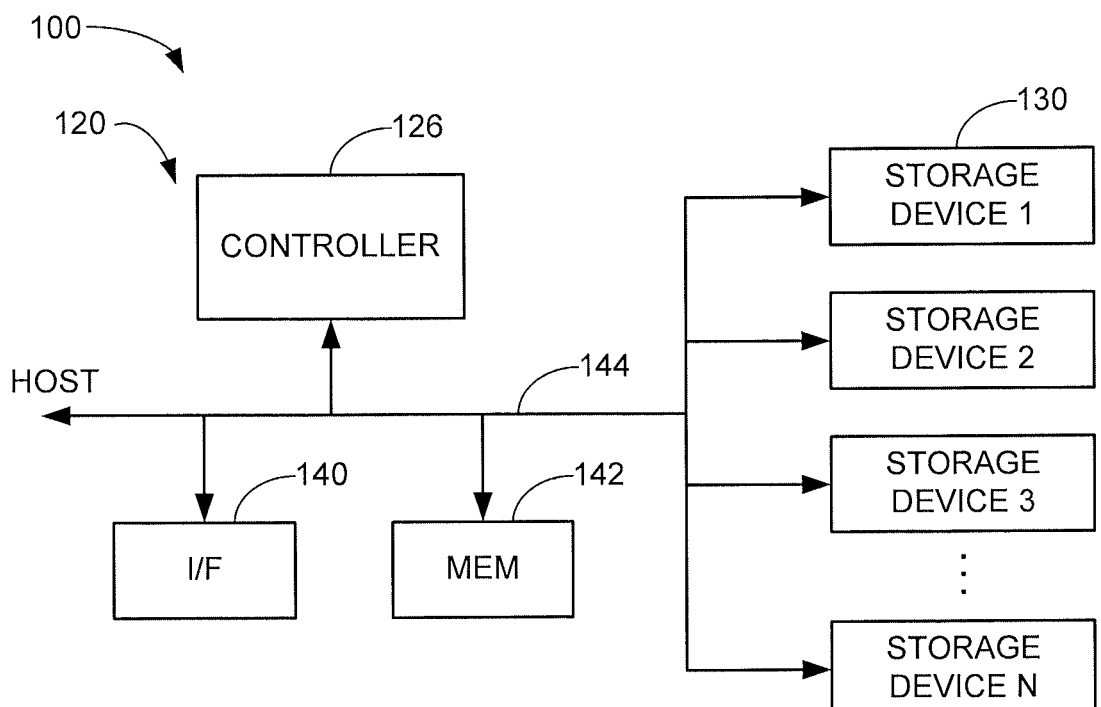
FIG. 4 is a functional block representation of the storage enclosure of FIG. 2.

FIG. 4 provides a functional block representation of the storage enclosure 110 of FIGS. 1-2 in accordance with some embodiments. Control modules on the control board 120 include the aforementioned controller 126 as well as an interface (I/F) circuit 140 and a local buffer memory (mem) 142. One or more bus structures 144 enable the passage of data and commands between the storage devices 130 (labeled 1 to N) and a host device, such as the local computer 104 in FIG. 1.

Figure 5:
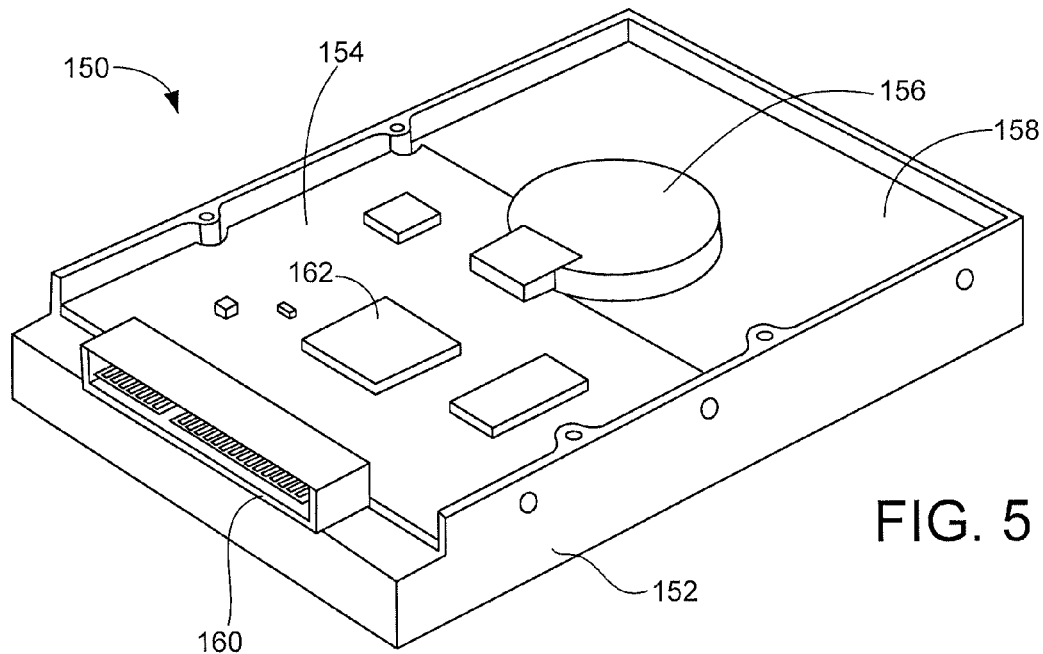
FIG. 5 depicts a hard disc drive (HDD) storage device in accordance with some embodiments.

FIG. 5 is a perspective view of a generalized hard disc drive (HDD) data storage device 150 in accordance with some embodiments. The HDD device 150 is similar to the devices 112, 130 discussed above, and includes a housing 152 and a control board 154. The housing 152 includes a spindle boss projection 156 which extends from a bottom surface 158 of the housing 152 to accommodate lower portions of a spindle motor used to rotate one or more magnetic recording discs (not separately shown). The control board 154 includes an interface connector 160 and a number of electronic components (one of which is denoted at 162). The interface connector 160 may be a SATA/SAS connector, or may take some other form.

Figure 6:
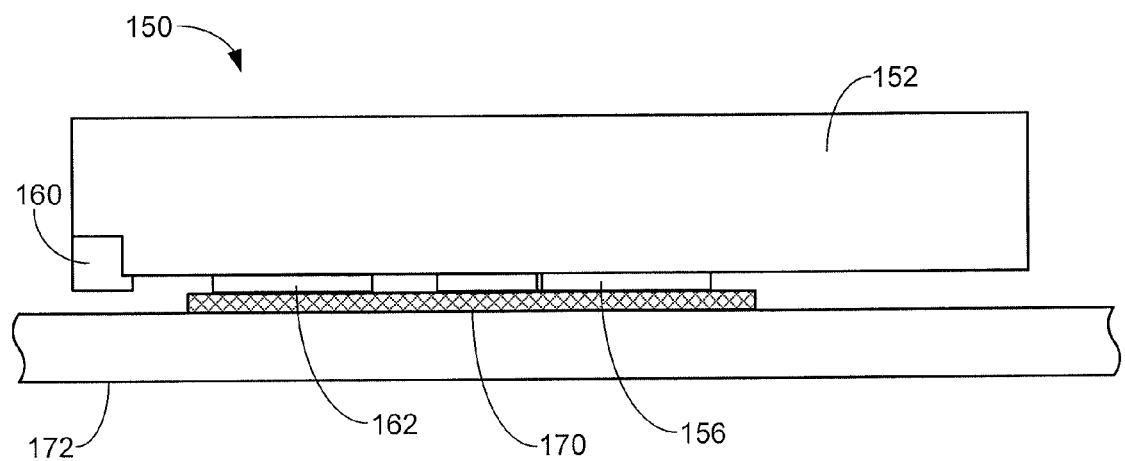
FIG. 6 shows the HDD storage device of FIG. 5 in conjunction with a layer of thermal interface material (TIM).

A thermal interface material (TIM) 170 is interposed between the device 150 and an underlying support structure 172, as represented in FIG. 6. The support structure 172 may be a sled mechanism such as the sleds 115 in FIG. 2, or may be another member. Generally, the structure 172 provides an efficient heat conduction path for the device by way of the TIM 170. The structure 172 may be formed of metal or other heat conductive material.

The TIM 170 can take a variety of forms. In some embodiments, the TIM 170 is a multi-layer structure of highly thermally conductive material. The layers can be flexible or rigid and formed of various materials such as metal, ceramic, silicon, polymers, etc. In some cases, the TIM structures are electrically insulating while providing efficient heat flow capabilities.

Figure 7:
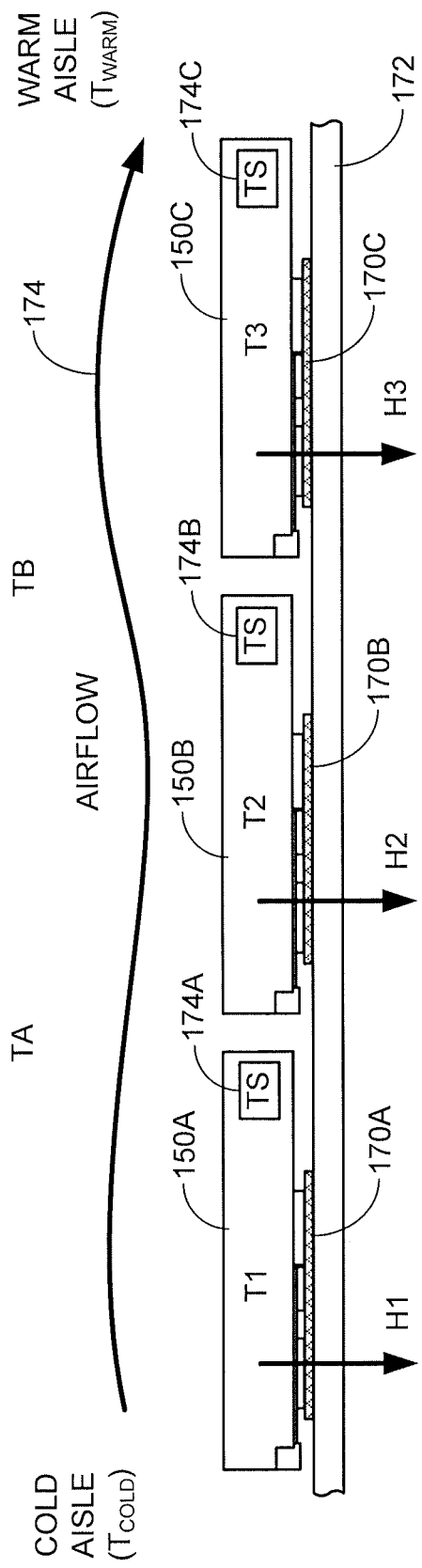
FIG. 7 is a thermal diagram illustrating operation of storage devices with different TIM configurations in accordance with some embodiments.

FIG. 7 illustrates the use of different TIM layers 170A, 170B and 170C between respective data storage devices 150A, 150B and 150C on a selected support structure 172. The storage devices are arranged sequentially in order (series) from a cold zone (cold aisle side 122, FIG. 2) at ambient temperature $T_{COLD}$ and a warm zone (warm aisle side 124, FIG. 2) at a second, higher ambient temperature $T_{WARM}$.

In some embodiments, the storage system 100 (FIG. 1) may be in an environmentally controlled room so that a user accessable walkway (aisle) adjacent the front side of the storage cabinet 102 is at the $T_{COLD}$ temperature, such as about T=20° C. Behind the cabinet 102 may be a second walkway adjacent the back side of the storage cabinet 102 at the $T_{WARM}$ temperature, which may be significantly higher such as about T=40° C. Other respective ambient temperatures may be present. It is contemplated that the warm aisle will be warmer than the cold aisle due to the venting of exhaust heat from the system as the fans (e.g., 118, FIG. 2) draw airflow through the storage enclosures 110 from the cold aisle side 122 to the warm aisle side 124 of the storage enclosures 110, as generally represented by arrow 174 in FIG. 7.

Two additional ambient temperatures are also denoted in FIG. 7: temperatures TA and TB. TA generally represents the ambient temperature between the first two devices 150A-150B, and TB represents the ambient temperature between the second and third devices 150B-150C. It is generally contemplated that $$T_{COLD} < TA < TB < T_{WARM}. \quad (1)$$

This relation will hold true although the respective temperature deltas may not be linear from one temperature to the next.

The standard heat flow equation can be represented as:

$$\dot{q} = h(T_{HOT} - T_{COLD})A \quad (2)$$

where q dot (H) is the rate of heat transfer, h is the material convection constant, A is the cross-sectional area of the heat flow path, and $T_{HOT}$ and $T_{COLD}$ are the temperatures of the two objects, respectively.

Each of the TIM layers 170A, 170B and 170C have different respective thermal performance so that each pass heat energy (H1, H2, H3) from the respective devices 150A, 150B, 150C at different rates. TIM layer 170C is the most thermally conductive material and TIM layer 170A is the least thermally conductive material. The thermal conductivity of TIM layer 170B is between those of layers 170A and 170C.

Those skilled in the art will appreciate that, under a substantially equal load condition, the three storage devices 150A, 150B and 150C will each nominally generate the same amount of heat energy. Instead of using the same thermal conductivity for each TIM layer so that the devices closest to the cold aisle operate significantly cooler than the devices farthest from the cold aisle, the respective temperatures of the devices, denoted as temperatures T1, T2 and T3, will be nominally equal; that is, T1≈T2≈T3 approximately within some relatively small specified threshold range (e.g., 45° C.±5° C., 45° C.±10%, etc.). Thus, nominally the same amount of heat energy is removed from device 150A as compared to 150C (and from device 150B), but the delta-change in temperature from localized ambient for each device will be different.

Some small variations in the temperatures from one device to the next will likely be present, so that the nominal thermal uniformity represented in FIG. 7 will be met so long as all of the temperatures are within the specified threshold range $T_{RANGE}$, such as ±2° C., ±4° C., ±5°, etc. As used herein, a nominally common operational temperature will be understood as being met if the temperatures of two or more devices are identical or substantially close so as to be at or within 20% of the average temperatures of the devices. In some embodiments, some upper threshold $T_{MAX}$ is also specified, such as $T_{MAX}$=65° C., so that all three temperatures T1, T2 and T3 are also less than $T_{MAX}$.

In sum, the thermal conductivities of the layers 170A, 170B, 170C are selected such that the temperatures T1, T2 and T3 of the respective devices 150A, 150B, 150C meet the following thermal uniformity constraints:

$$|T1-T2| < T_{RANGE}$$

$$|T1-T3| < T_{RANGE}$$

$$|T2-T3| < T_{RANGE}$$

$$T1, T2 \text{ and } T3 < T_{MAX} \quad (3)$$

The device operational temperatures T1-T3 can be measured using a temperature sensor or other mechanism located within, on or otherwise with each device, such as the internal temperature sensors (TS) 174A-174C depicted in FIG. 7. The respective devices 150A-150C can periodically transmit the temperatures T1-T3 to the control board or other control circuit of the storage enclosure to ensure compliance of the temperature requirements of equation (3).

While under normal conditions it will be expected that the devices under similar loading conditions will operate at a nominally common operational temperature, an outlier condition can be detected and corrective actions taken, such as by temporarily reducing the loading of the device, operating the device at a lower power setting, etc. In some cases, the monitoring of the temperatures can result in the declaration of an overtemperature fault, leading to the replacement of the associated device.

The respective TIM layers may dissipate W1 watts, W2 watts and W3 watts where W3>W2>W1. It is contemplated that each set of devices in each sled will have the same combination of TIM layers based on the respective distance of the device to the cold aisle side.

Figures 8, 9A, 9B:
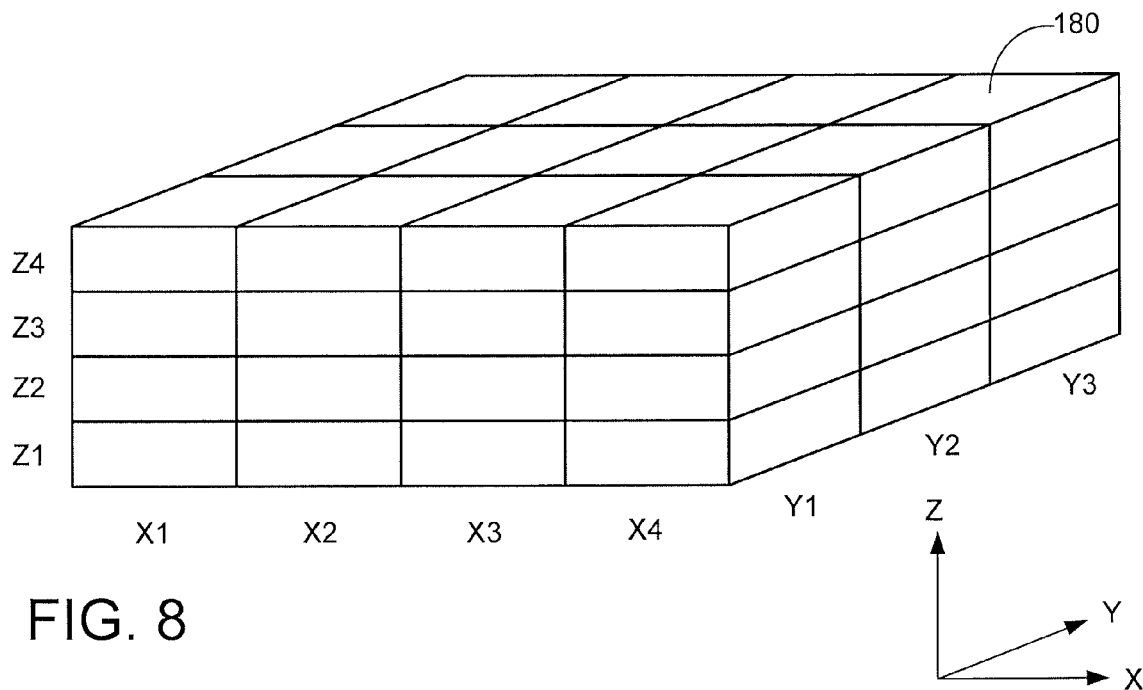
FIG. 8 depicts a three-dimensional (3D) array of storage devices with different TIM profiles in accordance with some embodiments.
FIGS. 9A-9B illustrate different layers of the 3D array of FIG. 8 having different TIM profiles.

Multi-dimensional solutions can be derived so that interior devices may have different TIM layer efficiencies as compared to exterior devices. FIG. 8 is a schematic depiction of storage devices 180 (similar to the devices discussed above) arranged into a three-dimensional (3D) stacked structure within an associated storage enclosure. Various elements such as the TIM layers, support structures, enclosure housing, sleds, power supplies, control board(s), fans, etc. have been omitted for clarity but are otherwise arranged within the associated storage enclosure as discussed above.

The 3D structure incorporates a total of 48 devices 180 in an (X,Y,Z) array of m by n by p (4×3×4) devices where m, n and p are plural numbers. The devices 180 are arranged along m=4 rows (X axis), n=3 columns (Y axis) and p=4 layers (Z axis). For convenience, the devices 180 are assigned array coordinates of X1 through X4, Y1 through Y3 and Z1 through Z4. The forward-most devices in FIG. 8 (e.g., those at position Y=Y1) are proximate the cold aisle and the rear-most devices (e.g., Y=Y3) are proximate the warm aisle.

FIG. 9A represents the 12 devices 180 on the first (lowest) layer of the array (e.g., the devices in layer Z1 from FIG. 8). Each set of three devices extending from the cold aisle to the warm aisle use a common set of TIM layers 170 referred to as TIM (A,B,C), where TIM(A) is a least heat conductive layer, TIM(C) is a most heat conductive layer and TIM(B) is an intermediate heat conductive layer. Stated another way, all of the devices with Y=Y1 use the TIM(A) layers, all of the devices with Y=Y2 use the TIM(B) layers, and all of the devices with Y=Y3 use the TIM(C) layers.

FIG. 9B represents the 12 devices 180 on the second (next intermediate) layer of the array (e.g., the devices in layer Z2 from FIG. 8). It will be noted that the outside sets of devices use the TIM(A,B,C) layers as in the first layer of FIG. 9A. However, the two interior sets (e.g., the devices with X=X2 and X=X3) use a different TIM sequence, namely TIM(D,E, F). As before, TIM(D) is the least heat conductive layer, TIM(F) is the most heat conductive layer and TIM(E) has an intermediate heat conductivity level. In some cases, D>A, E>B and F>C to account for the interior locations of the associated devices 180 that employ the TIM(D,E,F) sequence as compared to the exterior locations of the other devices that employ the TIM(A,B,C) sequence.

Thermal studies may be carried out to individually tailor sets of devices, and/or individual devices, so that each sequence of devices from the cold aisle to the warm aisle has its own thermal TIM profile. Some layers may use a common profile, such as in FIG. 9A, and some layers of devices may use different profiles based on location, as in FIG. 9B.

Device sequences that are axially aligned with power supplies or other higher temperature elements in the downstream direction may experience different ambient temperature profiles than sleds that are aligned with fans or other cooler elements. In some cases, most or every device may be provided with a TIM that is uniquely tailored to the placement, workload and other characteristics of that device to meet the thermal uniformity conditions of equation (3) for all devices in the storage enclosure/cabinet.

The use of flex circuits, sleds and other mechanisms discussed herein can improve airflow through the storage housing by eliminating cross-structures that would otherwise impede such airflow. However, it is also contemplated that the TIM sequences can be tailored to specifically address zones within the enclosure housing that receive substantially less airflow through the housing in order to maintain all of the devices at a nominally common operational temperature.

Figure 10:
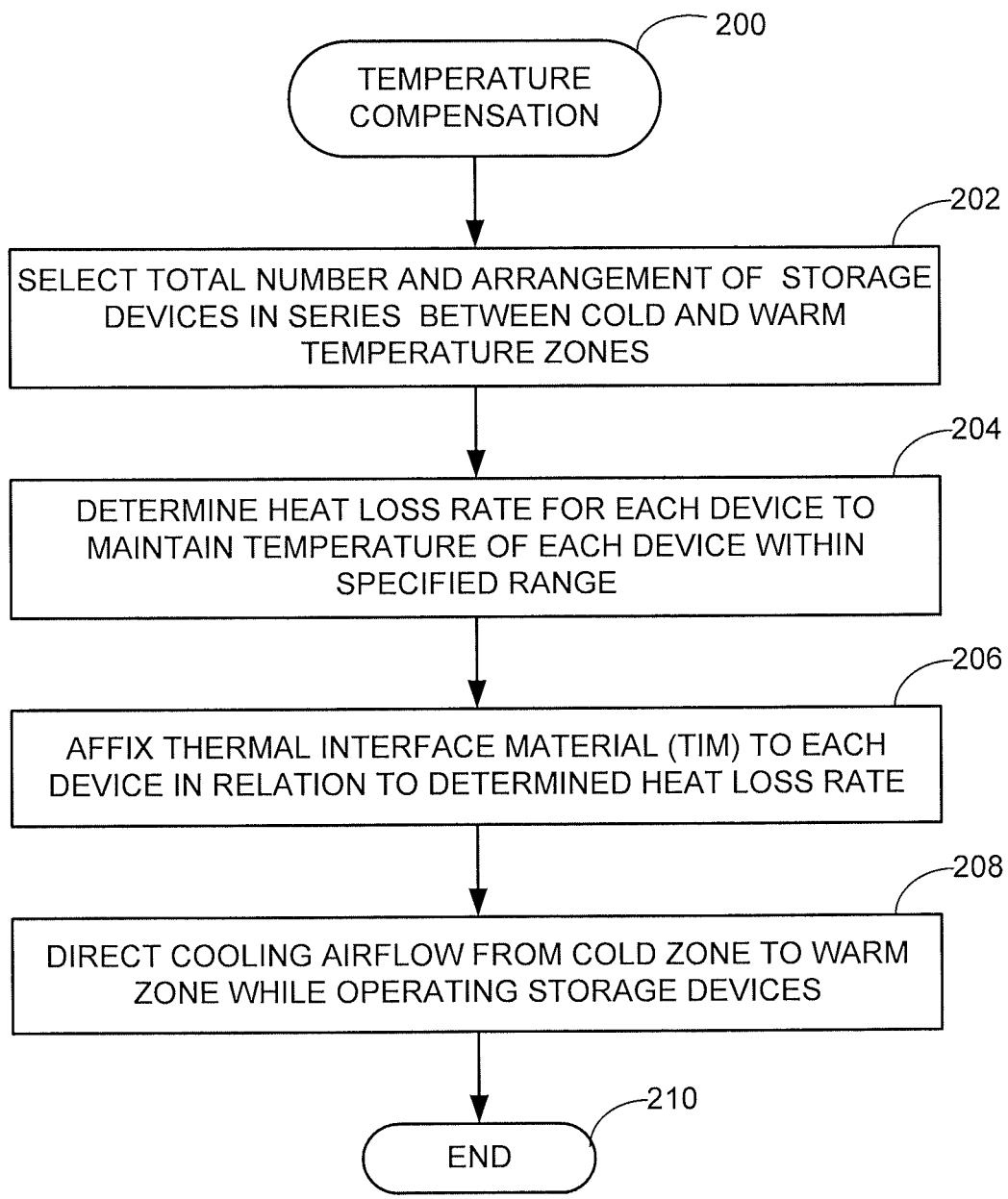
FIG. 10 is a flow chart for a temperature compensation routine generally illustrative of various embodiments of the present disclosure.

FIG. 10 is a flow chart for a TEMPERATURE COMPENSATION routine 200 to illustrate the foregoing discussion. The flowchart is merely exemplary and is not limiting, the various steps shown therein can be modified and/or omitted, and additional steps can be added as desired. For purposes of discussion, the routine 200 will be discussed in terms of the 36/2 U configuration of FIG. 2.

An initial storage device configuration is selected at step 202. The configuration will identify the total number of storage devices in the storage enclosure housing as well as their respective arrangements and locations (including the total number of such devices in series between the cold and warm zones). For example, the exemplary 36/2 U configuration of FIG. 2 uses 36 devices with the devices arranged into sets of three between the cold and hot zones.

Heat loss rates for each device are next determined at step 204 in order to meet the thermal uniformity conditions, such as those set forth by equation (3). This can be carried out via calculations and/or through empirical measurements using sensors and other data collection mechanisms.

Thermal interface material (TIM) layers are next affixed to the respective data storage devices at step 206 as required to meet the heat loss rates of step 208. This may include steps of assembling the storage enclosure 110 and installing the storage enclosure into a server rack 102 in an environmentally controlled room.

Cooling airflow is next directed through the storage enclosure at step 208 from the cold zone to the warm zone while operating the storage devices, thereby maintaining the devices in the thermal uniformity conditions specified in step 204. The routine then ends at step 210.

It will be appreciated that the storage enclosures as embodied herein provide a modular arrangement that can allow replacement of individual components (drives, fans, power supplies, cables, boards, etc.) in a fast and efficient manner. Equalizing the temperatures of the devices from cold aisle to warm aisle can improve operational efficiency and reliability, and further reduce localized hotspots within the storage enclosures. This can extend the reliability of the storage enclosure and the larger system.

Reference to thermal interface materials (TIMs) will include but not be limited to flexible membranes as embodied herein, but instead will be broadly understood as any suitable passive module configured to selectively conduct heat from a source to a sink.

While data storage devices such as HDDs, SSDs and hybrid drives have been exemplified as different types of processing devices to which the uniform heat dissipation operation can be applied, such is merely exemplary and is not limiting. Any number of different types of processing devices having a memory and which generate waste heat energy during operation can be subjected to the TIM thermal profiling as set forth herein.

The term "thermal interface material (TIM) module" and the like will be understood consistent with the foregoing discussion to describe a material, laminated structure, layer or other passive mechanism that provides an electrically insulative, conductive thermal (heat) dissipation path through a solid (non-gas) medium without the application of electrical power to the module. The TIM module may be flexible or rigid and may take a form including a heat sink with radiating fins, or a layer of thermally conductive material formed from ceramics, graphene, nanostructures, metals, gels, hydrocarbons, oxides, carbon, and other materials.

It is to be understood that even though numerous characteristics and advantages of various embodiments of the present disclosure have been set forth in the foregoing description, together with details of the structure and function of various embodiments thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
   an enclosed housing having a first side adjacent a cold zone at a lower ambient temperature and an opposing second side adjacent a warm zone at a higher ambient temperature;
   first and second processing devices arranged within the enclosed housing with the first processing device adjacent the cold zone and the second processing device adjacent the warm zone; and
   first and second thermal interface material (TIM) modules contactingly affixed to the first and second devices and having different heat conductivities so that the first and second devices are maintained at a nominally common operational temperature.

2. The apparatus of claim 1, wherein the enclosed housing is a housing of a networked multi-device data storage enclosure and the processing devices comprise data storage devices, and wherein the nominally common temperature is maintained during operation of the first and second processing devices to store data from a host.

3. The apparatus of claim 2, wherein the data storage devices comprise a selected one of hard disc drives (HDDs) with rotatable non-volatile recording media, solid state drives (SSDs) with solid state non-volatile recording memory or hybrid drives having both rotatable and solid state non-volatile recordable memory.

4. The apparatus of claim 1, wherein the TIM modules each comprise a flexible layer of heat conductive, electrically insulative material sandwiched between the respective first or second processing device and a thermally conductive support.

5. The apparatus of claim 1, further comprising at least one electrically powered fan within the enclosed housing configured to establish an interior airflow from the cold zone to the warm zone, the interior airflow passing through the enclosed housing adjacent the first and second processing devices.

6. The apparatus of claim 1, characterized as a storage enclosure mounted within a server cabinet in an environmentally controlled data processing center, the server cabinet having a front side in facing relation to a cold aisle and an opposing rear side in facing relation to a warm aisle, wherein an interconnection between the storage enclosure and a local computer is located adjacent the rear side of the server cabinet.

7. The apparatus of claim 1, wherein the first and second TIM layers contactingly engage at least one electrical component of the respective first and second processing devices.

8. The apparatus of claim 1, further comprising an electrically conductive and heat conductive support layer extending adjacent the first and second processing devices, wherein the first and second TIM layers are contactingly disposed between the first and second processing devices and the support layer.

9. The apparatus of claim 1, wherein the first processing device comprises a first temperature sensor and the second processing device comprises a second temperature sensor, wherein the first and second temperature sensors respectively generate a first operational temperature value and a second operational temperature value indicative of the operational temperatures of the respective first and second processing devices, and wherein the first and second processing devices respectively forward the first and second operational temperature values to a control circuit which compares the first operational temperature value to the second operational temperature value.

10. The apparatus of claim 1, wherein the first and second processing devices comprise data storage devices in a three-dimensional (3D) array of m by n by p devices where m, n and p are plural numbers, wherein the data storage devices are arranged into n sequences of devices arranged sequentially in said direction from the cold zone to the warm zone, wherein a first sequence of said n sequences has a first TIM profile and a different, second sequence of said sequences has a different, second TIM profile.

11. An apparatus comprising a storage enclosure for storing object data, comprising:
    an enclosed housing;
    a programmable processor having associated processor memory;
    a plural number n data storage devices sequentially arranged within the enclosed housing from a cold zone at a lower ambient temperature to a warm zone at a higher ambient temperature;
    a thermally conductive base support adapted to support the n data storage devices; and
    a plural number n thermal interface material (TIM) modules each contactingly arranged between an associated one of the n data storage devices and the base support and each having a different thermal conductivity so that the n data storage devices are maintained at a nominally common operational temperature.

12. The apparatus of claim 11, wherein the storage enclosure further comprises a three dimensional (3D) array of m by n by p data storage devices, each group of n data storage devices in the 3D array supported by a thermally conductive base support and having an associated TIM module contactingly disposed therebetween, wherein a first sequence of the n data storage devices has a first TIM thermal profile and a second sequence of the n data storage devices has a different, second TIM thermal profile.

13. The apparatus of claim 11, wherein the n data storage devices each comprise a selected one of hard disc drives (HDDs) with rotatable non-volatile recording media, solid state drives (SSDs) with solid state non-volatile recording memory or hybrid drives having both rotatable and solid state non-volatile recordable memory, and wherein the n TIM modules each comprise a flexible layer of heat conductive, electrically insulative material.

14. The apparatus of claim 11, wherein the storage enclosure further comprises at least one electrically powered fan within the enclosed housing configured to establish an interior airflow from the cold zone to the warm zone, the interior airflow passing through the enclosed housing adjacent the respective n data storage devices.

15. The apparatus of claim 11, wherein each of the n TIM modules contactingly engages at least one electrical component of the corresponding n data storage devices.

16. The apparatus of claim 11, wherein the selected sequence of n data storage devices is a first sequence of n data storage devices and the corresponding set of n thermal interface material (TIM) modules is a first sequence of TIM modules having a first thermal conductivity profile, and wherein the storage enclosure further comprises a second sequence of n data storage devices which sequentially extend from the cold zone toward the warm zone, and a corresponding second sequence of n TIM modules contactingly disposed between the second sequence of n data storage devices and a second thermally conductive support member, wherein the second sequence of n TIM modules have different respective thermal conductivities than the thermal conductivities of the first sequence of n TIM modules.

17. A method comprising:
    arranging a storage enclosure between a cold zone at a first ambient temperature and a warm zone at a higher second ambient temperature, the storage enclosure comprising an enclosed housing having a first side adjacent the cold zone and an opposing second side adjacent the warm zone, first and second processing devices arranged within the enclosed housing in sequential order so that the first processing device is closer to the cold zone and the second processing device is closer to the warm zone, and corresponding first and second thermal interface material (TIM) modules respectively affixed to the first and second devices;
    operating the first and second processing devices to transfer data from memories thereof to a host computer; and
    directing an airflow through the storage enclosure in a direction from the cold zone to the warm zone, wherein the second TIM module has a greater heat conductivity than the first TIM module so that the first and second devices are maintained at a nominally common operational temperature.

18. The method of claim 17, wherein directing an airflow through the storage enclosure comprises applying electrical power to a fan within the enclosed housing.

19. The method of claim 17, wherein the data storage devices comprise a selected one of hard disc drives (HDDs) with rotatable non-volatile recording media, solid state drives (SSDs) with solid state non-volatile recording memory or hybrid drives having both rotatable and solid state non-volatile recordable memory.

20. The method of claim 17, wherein the first and second TIM modules each comprise a flexible layer of heat conductive, electrically insulative material.

* * * * *